(12) United States Patent
Mankowski et al.

(10) Patent No.: US 9,615,484 B2
(45) Date of Patent: Apr. 4, 2017

(54) METHOD, SYSTEM AND APPARATUS FOR COOLING A MOBILE DEVICE

(71) Applicant: BLACKBERRY LIMITED, Waterloo (CA)

(72) Inventors: Peter Mankowski, Waterloo (CA); Ryan Alexander Geris, Waterloo (CA); Dietmar Frank Wennemer, Waterloo (CA)

(73) Assignee: BLACKBERRY LIMITED, Waterloo, Ontario (CA)

( * ) Notice: Subject to any disclaimer, the term of this patent is extended or adjusted under 35 U.S.C. 154(b) by 483 days.

(21) Appl. No.: 14/204,300

(22) Filed: Mar. 11, 2014

(65) Prior Publication Data

US 2015/0264833 A1    Sep. 17, 2015

(51) Int. Cl.
*H05K 5/00* (2006.01)
*H05K 7/20* (2006.01)
(Continued)

(52) U.S. Cl.
CPC ....... *H05K 7/20009* (2013.01); *F04B 45/065* (2013.01); *F04B 45/08* (2013.01);
(Continued)

(58) Field of Classification Search
CPC ..................................................... F04D 33/00
(Continued)

(56) References Cited

U.S. PATENT DOCUMENTS

| | | | |
|---|---|---|---|
| 7,556,406 B2* | 7/2009 | Petroski | F21V 29/02 362/294 |
| 8,322,889 B2 | 12/2012 | Petroski et al. | |
| 2008/0137307 A1* | 6/2008 | Orr | F28F 3/12 361/719 |
| 2009/0219673 A1* | 9/2009 | Tamura | G06F 1/203 361/676 |
| 2013/0301218 A1 | 11/2013 | Li et al. | |

FOREIGN PATENT DOCUMENTS

| | | |
|---|---|---|
| EP | 2096517 A2 | 9/2009 |
| EP | 2650751 A1 | 10/2013 |

OTHER PUBLICATIONS

Yifeng Fu et al: "Paper;A complete carbon-nanotube-based on-chip cooling solution with very high heat dissipation capacity;A complete carbon-nanotube-based on-chip cooling solution with very high heat dissipation capacity", Nanotechnology, IOP, Bristol, GB, vol. 23, No. 4, Jan. 6, 2012 (Jan. 6, 2012), p. 45304, XP020217853, ISSN: 0957-4484, DOI: 10.1088/0957-4484/23/4/045304.

(Continued)

*Primary Examiner* — Avinash Savani
*Assistant Examiner* — Vivek Shirsat
(74) *Attorney, Agent, or Firm* — Perry + Currier, Inc.

(57) ABSTRACT

Method, system and apparatus for cooling a mobile device is provided. The device comprises: a housing comprising one or more apertures; a heat producing device; a cooling apparatus adjacent the heat producing device, the cooling apparatus comprising: an inlet; an outlet; and, a thermal pump configured to: draw air from the inlet to the heat producing device to form heated air, and exhaust the heated air from the outlet; and, one or more carbon nanotubes, a respective entrance of each of the one or more carbon nanotubes located at the outlet of the cooling apparatus, and a respective exit of each of the one or more carbon nanotubes terminating at a respective aperture of the one or more apertures, so that the heated air is vented through the one or more apertures.

13 Claims, 8 Drawing Sheets

(51) Int. Cl.
| | |
|---|---|
| *F04B 45/06* | (2006.01) |
| *F04B 45/08* | (2006.01) |
| *F04D 25/16* | (2006.01) |
| *F04D 33/00* | (2006.01) |
| *G06F 1/20* | (2006.01) |
| *H01L 23/467* | (2006.01) |
| *H01L 23/373* | (2006.01) |
| *F28F 3/12* | (2006.01) |

(52) U.S. Cl.
CPC ........... *F04D 25/166* (2013.01); *F04D 33/00* (2013.01); *G06F 1/203* (2013.01); *H01L 23/373* (2013.01); *H01L 23/467* (2013.01); *H05K 7/20145* (2013.01); *H05K 7/20172* (2013.01); *F28F 3/12* (2013.01); *F28F 2255/20* (2013.01); *F28F 2260/02* (2013.01); *H01L 2924/0002* (2013.01)

(58) Field of Classification Search
USPC ..................... 454/184; 417/410.2; 977/962
See application file for complete search history.

(56) References Cited

OTHER PUBLICATIONS

Liyong Chen et al: "Controlling Reversible Elastic Deformation of CarbonNanotube Rings", Journal of the American Chemical Society, vol. 133, No. 25, Jun. 29, 2011 (Jun. 29, 2011), pp. 9654-9657, XP055200690, ISSN: 0002-7863, DOI: 10.1021/ja2022976.

Ki-Hong Park et al: "A study on a flexible wing with up-down vibration in a pulsating flow of cooling air to improve heat transfer efficiency", Heat and Mass Transfer, vol. 49, No. 10,Jun. 9, 2013 (Jun. 9, 2013), pp. 1459-1470, XP055200559, ISSN: 0947-7411, DOI : 10.1007/s00231-013-1188-x.

Corresponding European Patent Application No EP 15158406 Search Report dated Jul. 29, 2015.

T.D. Yuzvinsky et al., "Shrinking a Carbon Nanotube", Nano Letters, vol. 6, No. 12, pp. 2718-2722, 2006.

"Murata Microblowers," http://ca.mouser.com/new/murataelectronics/muratamicroblowers/, as early as Feb. 11, 2014.

\* cited by examiner

METHOD, SYSTEM AND APPARATUS FOR COOLING A MOBILE DEVICE

FIELD

The specification relates generally to cooling devices, and specifically to a method, system and apparatus for cooling a mobile device.

BACKGROUND

Consumer electronics devices generally have little to no ability to intelligently manage thermal issues while operating. For example, mobile devices simply direct heat away from hot spots using fans and the like, the heat remaining internal to the device unless thermally radiated through a housing. Alternatively, fans and/or microblowers can be used; however for mobile devices, such fans/microblowers can use valuable space within the mobile device.

BRIEF DESCRIPTIONS OF THE DRAWINGS

For a better understanding of the various implementations described herein and to show more clearly how they may be carried into effect, reference will now be made, by way of example only, to the accompanying drawings in which.

DETAILED DESCRIPTION

Figure 1:
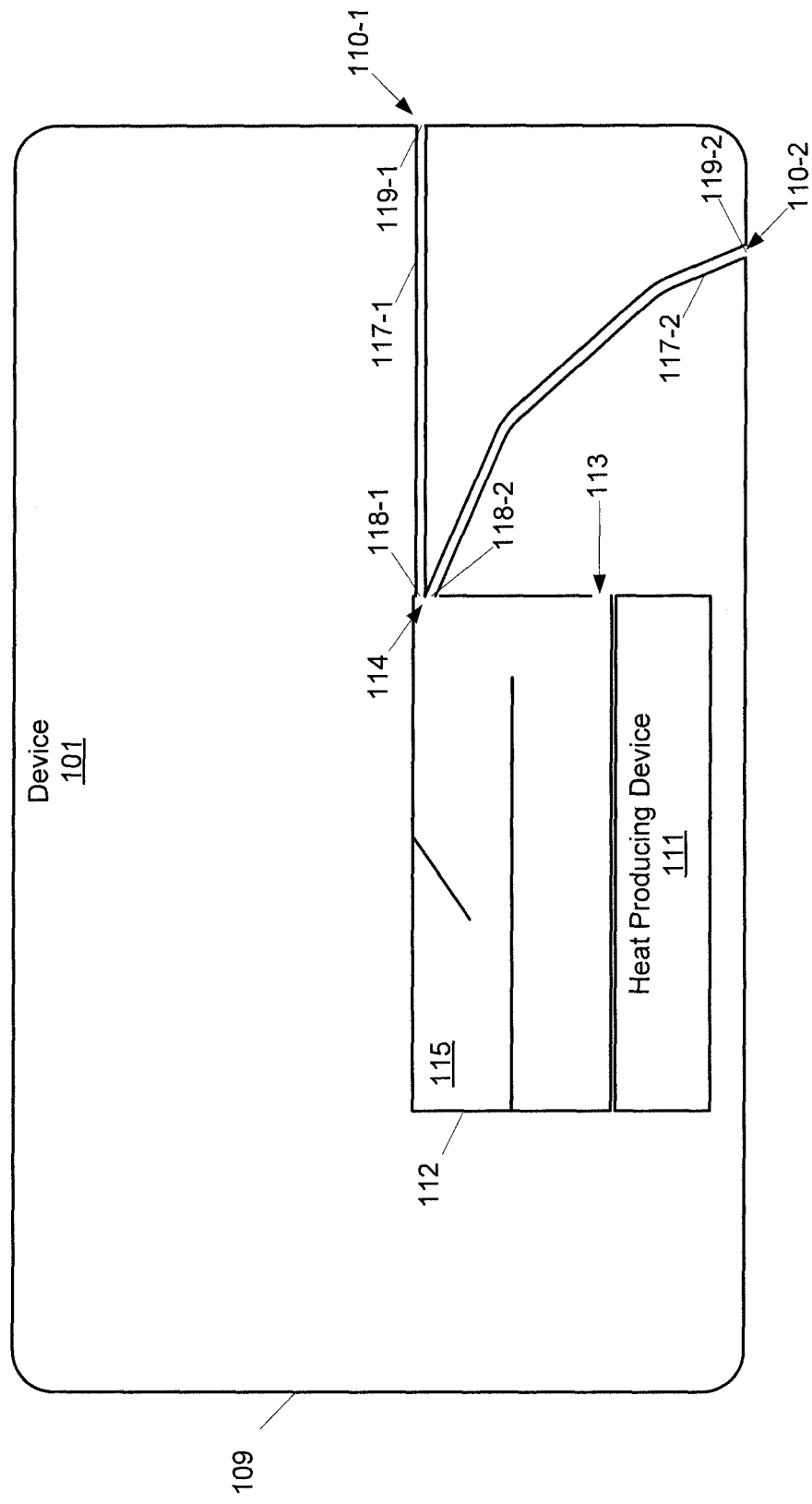
FIG. 1 depicts a schematic diagram of cooling components of a device, according to non-limiting implementations.

The present disclosure describes examples of a device with an intelligently managed cooling system. The cooling system comprises a thermal pump that directs air heated by a heat producing device (including, but not limited to, a processor) to one or more carbon nanotubes, which direct the heated air to apertures in the device, including, but not limited to existing apertures, for example apertures for ports, connectors, speakers, microphones and the like. Hence, the heated air is specifically directed out of the device. The carbon nanotubes can also be controlled to pump the heated air out of the device using one or more controllers to open and close portions of the carbon nanotubes by applying a voltage and/or current thereto. The controllers can also be used to close specific carbon nanotubes in order to temporarily prevent the heated air from being directed to specific apertures, for example, to a speaker aperture in scenarios when the device is in use as a mobile phone and the like. Indeed, the controller(s) can be used to direct the heated air to specific apertures and/or to restrict flow of air to other specific apertures.

In this specification, elements may be described as "configured to" perform one or more functions or "configured for" such functions. In general, an element that is configured to perform or configured for performing a function can perform the function, or is enabled to perform the function, or is suitable for performing the function, or is adapted to perform the function, or is operable to perform the function, or is otherwise capable of performing the function.

Furthermore, as will become apparent, in this specification certain elements may be described as connected physically, electronically, or any combination thereof, according to context. In general, components that are electrically connected are configured to communicate (that is, they are capable of communicating) by way of electric signals. According to context, two components that are physically coupled and/or physically connected may behave as a single element. In some cases, physically connected elements may be integrally formed, e.g., part of a single-piece article that may share structures and materials. In other cases, physically connected elements may comprise discrete components that may be fastened together in any fashion. Physical connections may also include a combination of discrete components fastened together, and components fashioned as a single piece.

An aspect of the specification provides a device comprising: a housing comprising one or more apertures; a heat producing device; a cooling apparatus adjacent the heat producing device, the cooling apparatus comprising: an inlet; an outlet; and, a thermal pump configured to: draw air from the inlet to the heat producing device to form heated air, and exhaust the heated air from the outlet; and, one or more carbon nanotubes, a respective entrance of each of the one or more carbon nanotubes located at the outlet of the cooling apparatus, and a respective exit of each of the one or more carbon nanotubes terminating at a respective aperture of the one or more apertures, so that the heated air is vented through the one or more apertures.

Each of the one or more carbon nanotubes can comprise respective closing portions, the device can further comprise one or more controllers electrically connected to the respective closing portions, each of the one or more controllers configured to independently open and close the respective closing portions of each of the one or more carbon nanotubes in a sequence to assist with flow of the heated air there through. Each of the one or more controllers can be further configured to close one or more of the respective closing portions to restrict flow of the heated air there through to prevent the heated air from flowing through an associated carbon nanotube. The device can further comprise a processor configured to: communicate with the one or more controllers to close a given carbon nanotube based on a given associated event occurring at the processor. The device can further comprise a communication interface, a microphone, and speaker for conducting voice calls at the device, the speaker comprising a speaker aperture, of the one or more apertures, wherein the processor can be further configured to: detect a voice call occurring at the device and communicate with the one or more controllers to close a carbon nanotube connecting the cooling apparatus to the speaker aperture. The processor can be further configured to: detect that the voice call has ended and communicate with the one or more controllers to open the carbon nanotube connecting the cooling apparatus to the speaker aperture.

The device can further comprise one or more flex cables, at least a portion of each of the one or more carbon nanotubes mounted thereupon. The cooling apparatus can also be mounted on the one or more flex cables.

The device can further comprise a manifold located at the outlet, the manifold comprising respective entrances for each of the one or more carbon nanotubes.

The respective exit of one or more of the carbon nanotubes can comprise a hole in a connector at a respective aperture.

The thermal pump can comprise two electromagnets, a flexible single wing fan located there between, and a blocking flap, the electromagnets configured to control the flexible single wing fan to vibrate to generate vortices in the air, and the blocking flap configured to direct the vortices towards the outlet.

Walls of each of the one more carbon nanotubes can be configured to conduct heat away from the cooling apparatus.

Each of the one or more apertures can comprise an aperture for one or more of a connector for an auxiliary device, an HDMI (High-Definition Multimedia Interface) port, a USB (Universal Serial Bus) port, an audio jack, a speaker and a microphone.

The device can further comprise one or more of a mobile communication device, a mobile electronic device, a tablet device, and a laptop device.

Attention is first directed to FIG. 1 which depicts a schematic diagram of cooling components of a device 101 comprising: a housing 109 comprising one or more apertures 110-1, 110-2; a heat producing device 111; a cooling apparatus 112 adjacent heat producing device 111, cooling apparatus 112 comprising: an inlet 113; an outlet 114; and, a thermal pump 115 configured to: draw air from inlet 113 to heat producing device 111 to form heated air, and exhaust the heated air from outlet 114; and, one or more carbon nanotubes 117-1, 117-2, a respective entrance 118-1, 118-2 of each of the one or more carbon nanotubes located at outlet 114 of cooling apparatus 112, and a respective exit 119-1, 119-2 of each of one or more carbon nanotubes 117-1, 117-2 terminating at a respective aperture of the one or more apertures 110-1, 110-2, so that the heated air is vented through the one or more apertures 110-1, 110-2.

Apertures 110-1, 110-2 will be interchangeably referred to hereafter, collectively, as apertures 110, and generically as an aperture 110. Similarly, carbon nanotubes 117-1, 117-2 will be interchangeably referred to hereafter, collectively, as carbon nanotubes 117, and generically as a carbon nanotube 117. Similarly, entrances 118-1, 118-2 will be interchangeably referred to hereafter, collectively, as entrances 118, and generically as an entrance 118. Similarly, exits 119-1, 119-2 will be interchangeably referred to hereafter, collectively, as exits 119, and generically as an exit 119.

Cooling apparatus 112 can further comprise walls for containing the air, inlet 113 and outlet 114 comprising apertures in the walls: in other words, the walls generally define an enclosed space other than inlet 113 and outlet 114.

Further, while two apertures 110, and two carbon nanotubes 117 are depicted, implementations, can include fewer than two apertures, or more than two apertures, and/or fewer than two carbon nanotubes, or more than two carbon nanotubes. Further, while apertures 110 and carbon nanotubes 117 are depicted in a one-to-one relationship, in other implementations, the relationship can be other than one-to-one; for example, there can be fewer carbon nanotubes 117 than apertures 110, or more carbon nanotubes 117 than apertures. For instance, not each aperture 110 can be associated with a carbon nanotube 117 and/or there can be more than one carbon nanotube 117 leading to a given aperture.

While not depicted, it is appreciated that device 101 can further comprise a manifold located at outlet 114, the manifold comprising respective entrances 118 for each of one or more carbon nanotubes 117 and/or distributing heated air from thermal pump 115 to carbon nanotubes 117.

Each carbon nanotube 117 can comprise a single layer and/or two layer carbon nanotube. In particular non-limiting implementations, each carbon nanotube 117 can comprise a "single walled" nanotube ("SWNT"), however in other implementations, each carbon nanotube 117 can comprise a multi-walled nanotube ("MWNT"); in other implementations, carbon nanotubes 117 can comprise a combination of SWNTs and MWNTs. Each carbon nanotube 117 can have a diameter of about 1 nm, however the diameter is not to be considered particularly limiting.

Device 101 can be any type of electronic device that can be used in a self-contained manner. Device 101 can include, but is not limited to, any suitable combination of electronic devices, communications devices, computing devices, personal computers, laptop computers, portable electronic devices, mobile computing devices, portable computing devices, tablet computing devices, laptop computing devices, desktop phones, telephones, PDAs (personal digital assistants), cellphones, smartphones, e-readers, internet-enabled appliances and the like. Other suitable devices are within the scope of present implementations.

Figure 2:
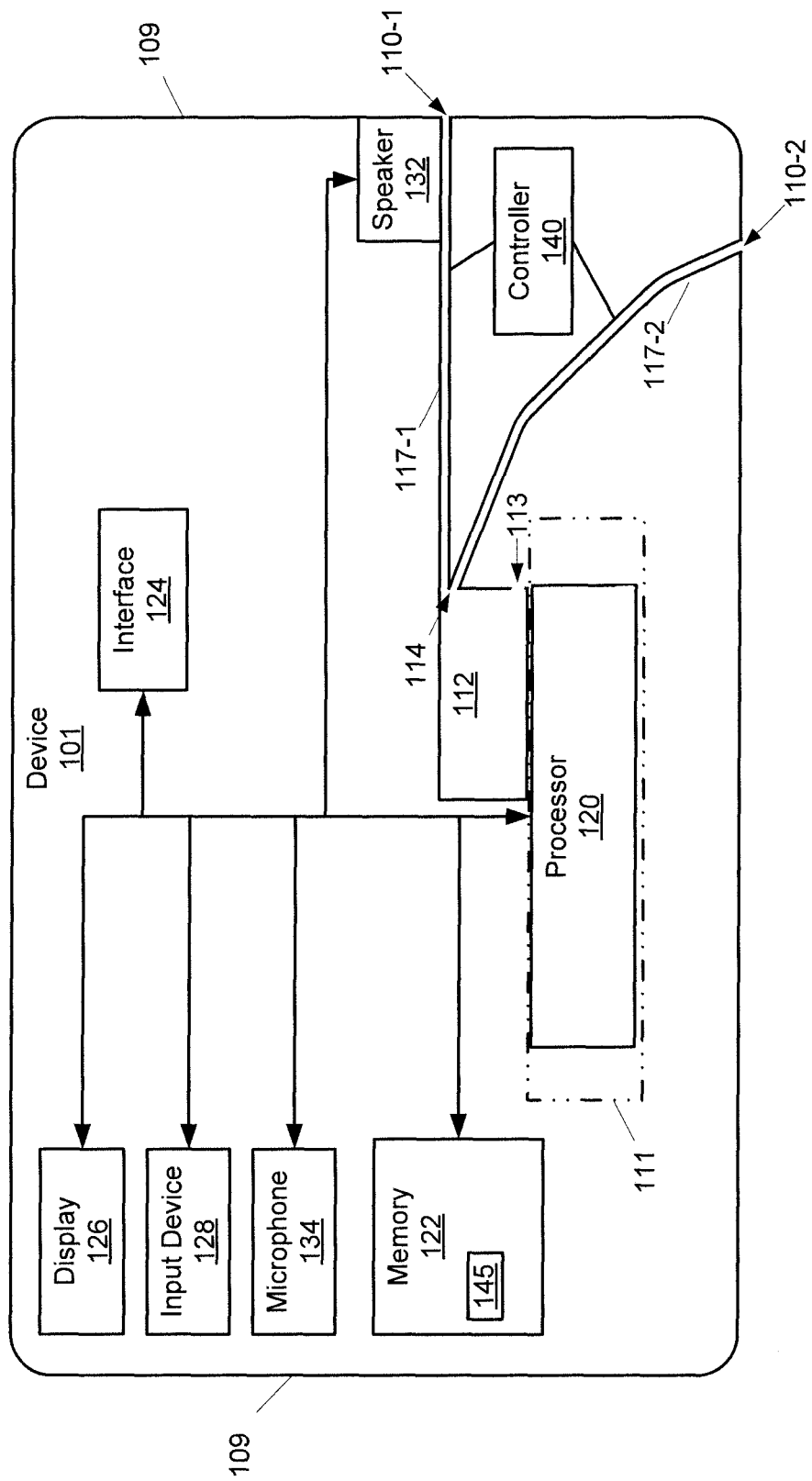
FIG. 2 depicts a schematic block diagram of the device of FIG. 1, according to non-limiting implementations.

Attention is next directed to FIG. 2, which depicts a schematic block diagram of device 101, when device 101 comprises a mobile device for making voice calls. Device 101 hence can further comprise a processor 120, a memory 122, a display 126, a communication interface 124, at least one input device 128, a speaker 132 and a microphone 134. In depicted implementations, heat producing device 111 comprises processor 120, however, in other implementations, other heat producing devices can be present in device 101 and cooled using the cooling apparatus of FIG. 1 and/or another set of cooling apparatus similar to the cooling apparatus of FIG. 1; in other words, device 101 can comprise more than one set of cooling apparatus as described with reference to FIG. 1. While FIG. 2 also depicts cooling components shown in FIG. 1, and described above, not all the cooling components are labelled, though they are understood to be nonetheless present.

In depicted implementations, carbon nanotube 117-1 connects outlet 114 of thermal pump 115 with aperture 110-1, and speaker 132 is located at aperture 110-1 hence, aperture 110-1 can also be referred to as speaker aperture 110-1. Carbon nanotube 117-2 connects outlet 114 of thermal pump 115 with aperture 110-2; while not depicted aperture 110-2 can comprise an aperture for one or more of a connector for an auxiliary device, an HDMI (High-Definition Multimedia Interface) port, a USB (Universal Serial Bus) port, an audio jack, and microphone 134 and/or another speaker, and the like.

As depicted, device 101 further comprises one or more controllers 140, which can be in communication with processor 120, to control carbon nanotubes 117, as described in further detail below.

Device 101 will next be generally described. Device 101 comprises a housing 109, which houses components of device 101. Housing 109 can include an external chassis and an internal frame configured to provide structural integrity to device 101. Housing 109 can be further configured to support components of device 101 attached thereto, for example, display 126. Apertures 110 are provided in housing 109 to provide outlets for speaker 132, microphone 134, and/or ports for auxiliary devices (e.g. devices which can be connected to device 101 via a cable and/or connector, and the like).

Device 101 further comprises at least one input device 128 generally configured to receive input data, and can comprise any suitable combination of input devices, including but not limited to a keyboard, a keypad, a pointing device, a mouse, a track wheel, a trackball, a touchpad, a touch screen and the like. Other suitable input devices are within the scope of present implementations.

Input from input device 128 is received at processor 120 (which can be implemented as a plurality of processors, including but not limited to one or more central processors (CPUs)). Processor 120 is configured to communicate with a memory 122 comprising a non-volatile storage unit (e.g. Erasable Electronic Programmable Read Only Memory ("EEPROM"), Flash Memory) and a volatile storage unit (e.g. random access memory ("RAM")). Programming instructions that implement the functional teachings of device 101 as described herein are typically maintained, persistently, in memory 122 and used by processor 120 which makes appropriate utilization of volatile storage during the execution of such programming instructions. Those skilled in the art will now recognize that memory 122 is an example of computer readable media that can store programming instructions executable on processor 120. Furthermore, memory 122 is also an example of a memory unit and/or memory module.

Memory 122 can optionally store an application 145 that, when processed by processor 120, enables processor 120 to communicate with one or more controllers 140 to control carbon nanotubes 117, as described below. Furthermore, memory 122 storing application 145 is an example of a computer program product, comprising a non-transitory computer usable medium having a computer readable program code adapted to be executed to implement a method, for example a method stored in application 145.

Processor 120 can be further configured to communicate with display 126, and microphone 134 and speaker 132. Display 126 comprises any suitable one of, or combination of, flat panel displays (e.g. LCD (liquid crystal display), plasma displays, OLED (organic light emitting diode) displays, capacitive or resistive touchscreens, CRTs (cathode ray tubes) and the like. Microphone 134 comprises any suitable microphone for receiving sound and converting to audio data. Speaker 132 comprises any suitable speaker for converting audio data to sound to provide one or more of audible alerts, audible communications from remote communication devices, and the like. In some implementations, input device 128 and display 126 are external to device 101, with processor 120 in communication with each of input device 128 and display 126 via a suitable connection and/or link.

Processor 120 also connects to communication interface 124 (interchangeably referred to as interface 124), which can be implemented as one or more radios and/or connectors and/or network adaptors and/or transceivers, configured to wirelessly communicate with one or more communication networks (not depicted) via antennas (not depicted) at device 101. It will be appreciated that interface 124 is configured to correspond with network architecture that is used to implement one or more communication links to the one or more communication networks, including but not limited to any suitable combination of USB (universal serial bus) cables, serial cables, wireless links, cell-phone links, cellular network links (including but not limited to 2G, 2.5G, 3G, 4G+ such as UMTS (Universal Mobile Telecommunications System), GSM (Global System for Mobile Communications), CDMA (Code division multiple access), FDD (frequency division duplexing), LTE (Long Term Evolution), TDD (time division duplexing), TDD-LTE (TDD-Long Term Evolution), TD-SCDMA (Time Division Synchronous Code Division Multiple Access) and the like, wireless data, Bluetooth™ links, NFC (near field communication) links, WLAN (wireless local area network) links, WiFi links, WiMax links, packet based links, the Internet, analog networks, the PSTN (public switched telephone network), access points, and the like, and/or a combination. Specifically, interface 124 comprises radio equipment (i.e. a radio transmitter and/or radio receiver and/or a transceiver) for receiving and transmitting signals using antennas (not depicted).

While not depicted, device 101 further comprises a power source, not depicted, for example a battery or the like. In some implementations the power source can comprise a connection to a mains power supply and a power adaptor (e.g. an AC-to-DC (alternating current to direct current) adaptor, and the like).

In any event, it should be understood that a wide variety of configurations for device 101 are contemplated.

Figure 3:
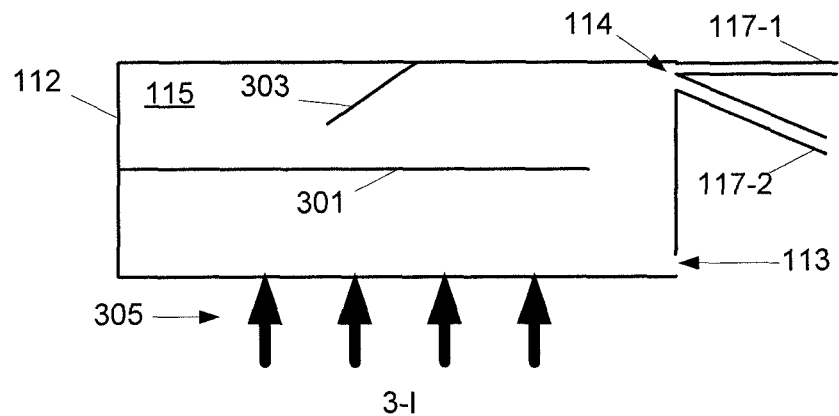
FIG. 3 depicts a sequence of views of a cooling apparatus of the device of FIG. 1 in operation, as well as details of a thermal pump, according to non-limiting implementations.
Figure 3:
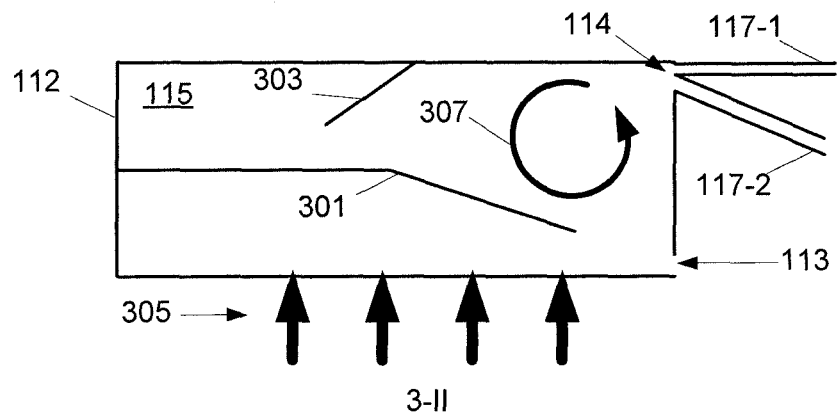
Figure 3:
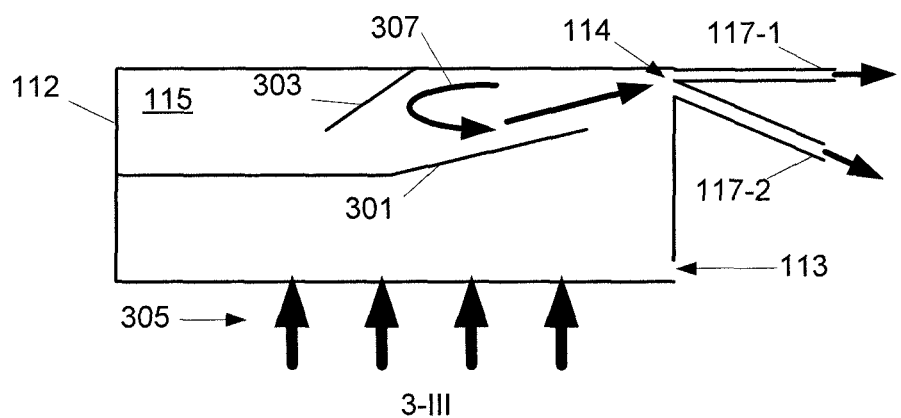

Attention is next directed to FIG. 3, which depicts a sequence 300 of views 3-I, 3-II, 3-III of cooling apparatus 112 in operation, as well as details of thermal pump 115, in particular non-limiting implementations. In these implementations, thermal pump 115 comprises: two electromagnets (not depicted), a flexible single wing fan 301 located there between, and a blocking flap 303, the electromagnets configured to control flexible single wing fan 301 to vibrate to generate vortices in the air, and blocking flap 303 configured to direct the vortices towards outlet 114, as described below.

While a specific thermal pump is described herein, it is appreciated that other thermal pumps are within the scope of present implementations, as long as such other thermal pumps have a low profile and can direct heated air to carbon nanotubes 117.

While in FIG. 3, only a portion of carbon nanotubes 117 are depicted, each of carbon nanotubes 117 nonetheless terminate at a respective aperture 110, as depicted in FIG. 1.

In view 3-I, heat 305 from heat producing device 111 heats air within thermal pump 115.

In view 3-II, the electromagnets cause flexible wing fan 301 to vibrate, for example in a direction towards inlet 113, which causes a vortex 307 of heated air to be formed adjacent outlet 114, blocking flap 303 causing vortex 307 to be contained in the area adjacent outlet 114.

In view 3-III, the electromagnets cause flexible wing fan 301 to vibrate towards outlet 114 (and away from inlet 113), which causes vortex 307 of heated air to be forced towards outlet 114, and into carbon nanotubes 117, and finally to apertures 110. The movement of flexible wing fan 301 away from inlet 113 also causes further air to be drawn into cooling apparatus 112 via inlet 113. The mechanism in views 3-II, 3-III then repeat to cool heat producing device 111, with each vibration cycle of flexible wing fan 301 to draw air in through inlet 113, generating further vortices of heated air, and forcing the heated air through outlet 114 into carbon nanotubes 117, and out of device 101 through apertures 110.

Figure 4:
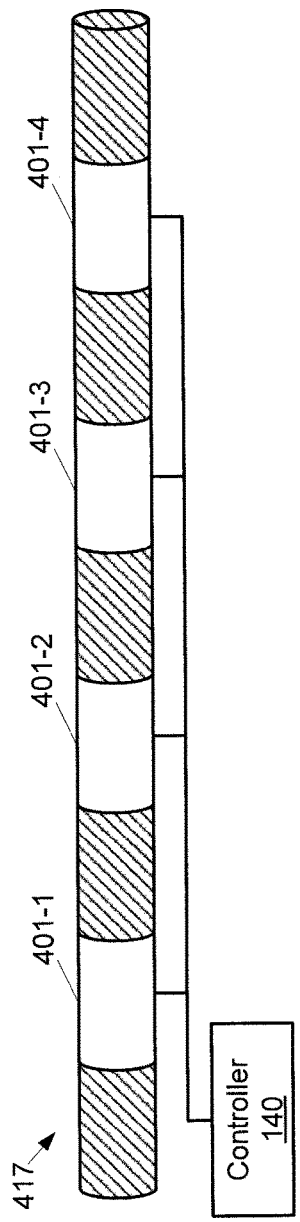
FIG. 4 depicts a carbon nanotube, according to non-limiting implementations.

Attention is next directed to FIG. 4, which depicts a carbon nanotube 417, similar to carbon nanotubes 117. At least a portion of carbon nanotube 117 is electrically connected to one or more controllers 140. Specifically, carbon nanotube 417 comprises closing portions 401-1, 401-2,

401-3, 401-4, will be interchangeably referred to hereafter, collectively, as closing portions 401, and generically as a closing portion 401. Further, one or more controllers 140 are electrically connected to closing portions 401. Areas of carbon nanotube 417 between closing portions 401 can be electrically isolated there from and/or one or more electrodes can be located on each closing portion 401 and absent from areas in between closing portions 401.

One or more controllers 140 are configured to independently open and close the closing portions 401 of carbon nanotube 417 in a sequence to assist with flow of heated air there through, by applying voltage and/or current thereto, as described hereafter.

Figure 5:
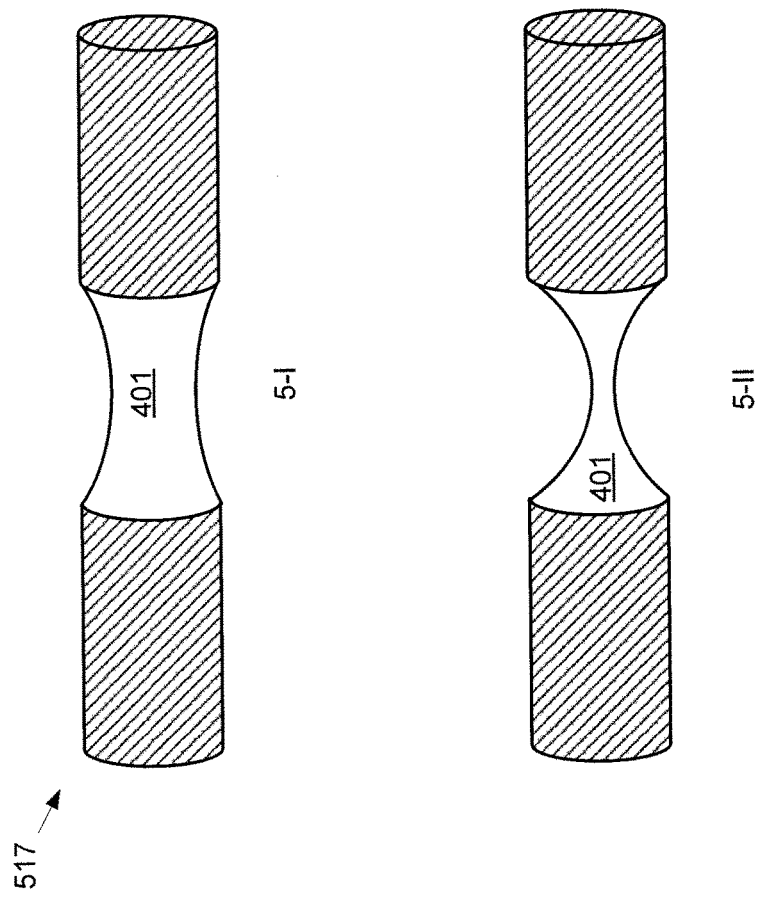
FIG. 5 depicts a portion of the carbon nanotube of FIG. 5 that includes a closing portion shown in two operational modes, according to non-limiting implementations.

For example, attention is next directed to FIG. 5, which depicts a portion 517 of a carbon nanotube 417 that includes a closing portion 401; while controller 140 is not depicted, it is appreciated that closing portion 401 is electrically connected to controller 140. In any event, when a voltage and/or current is applied to closing portion 401, using controller 140, a diameter of closing portion 401 narrows and/or constricts. The diameter to which closing portion 401 narrows and/or constricts can be controlled based on the voltage and/or current applied; for example, in view 5-I the diameter of closing portion 401 is narrowed and/or constricted by about 30%, while in view 5-II the diameter of closing portion 401 is narrowed and/or constricted so that air can no longer flow there through.

When electrical current is applied to closing portion 401, the carbon chain of carbon nanotube 417 offers no resistance to diameter changes due to selective atom vacancies. To change the diameter of the carbon wall, three factors are monitored and/or controlled, for example by one or more controllers 140 and/or processor 120:

1. The voltage and/or current are controlled to be below a threshold of electrical breakdown of a carbon nanotube;
2. When the constriction process is initialized, applied voltage is monitored and tuned in real time to offer compensation for fast changing resistance; and
3. To achieve maximum constriction, current is increased in a non-linear mode.

Figure 6:
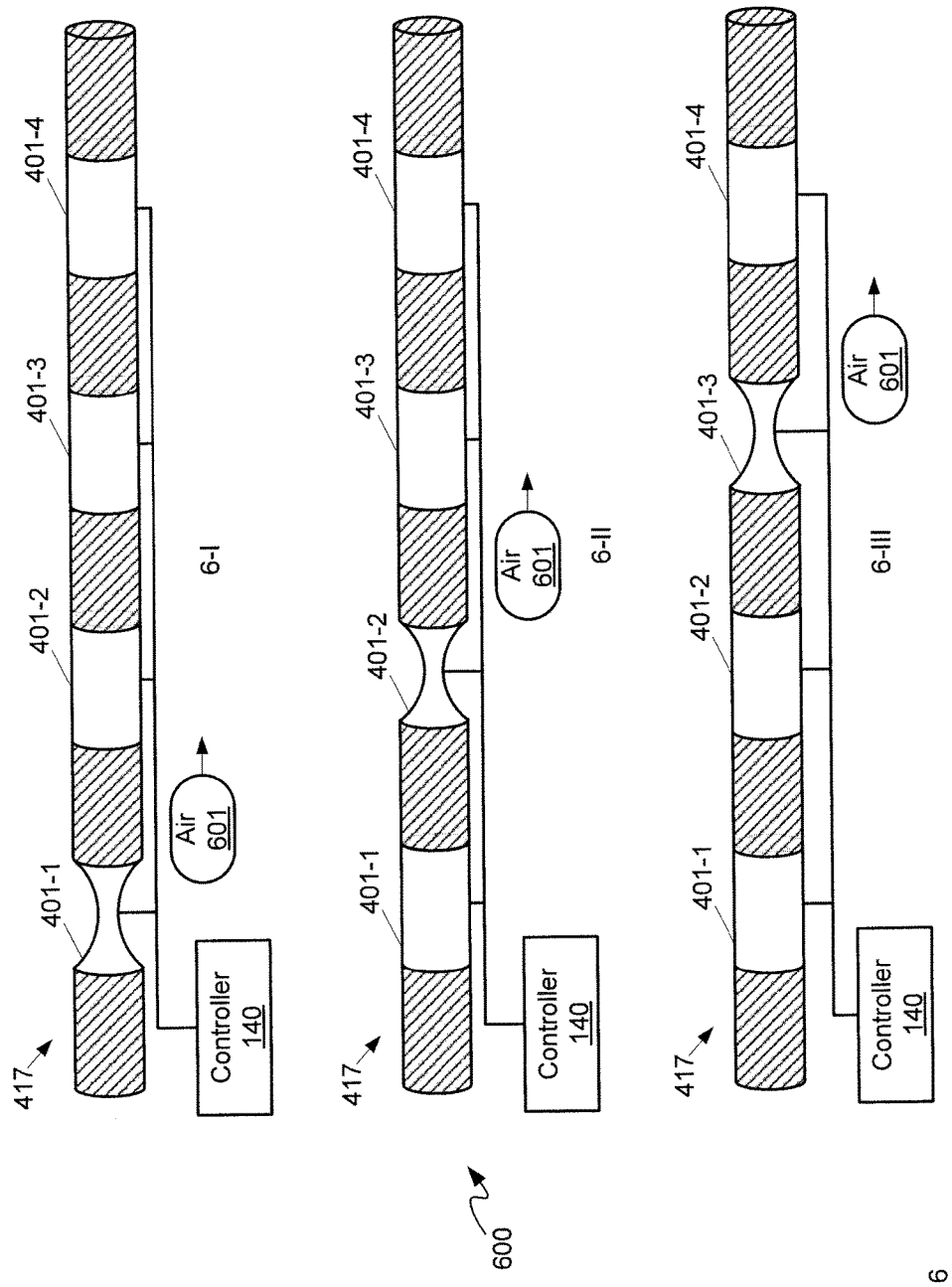
FIG. 6 depicts controlling of closing portions of the carbon nanotube of FIG. 5 in a sequence to assist with flow of air there through, according to non-limiting implementations.

Attention is next directed to FIG. 6, which depicts controlling of closing portions 401 of carbon nanotube 417 in a sequence 600 to assist with flow of air there through. In view 6 I, controller 140 controls closing portion 401-1 to constrict, causing at least a portion of air 601 contained therein to be moved towards closing portion 401-2 (air 601 is depicted external to carbon nanotube 417 for clarity, though air 601 is appreciated to be contained therein); in view 6 II, controller 140 controls closing portion 401-2 to constrict while closing portion 401-1 is controlled to open, causing air 601 to move towards closing portion 401-3; and, in view 6 III, controller 140 controls closing portion 401-3 to constrict while closing portion 401-2 is controlled to open, causing air 601 to move towards closing portion 401-4. While not depicted, controller 140 then controls closing portion 401-4 to constrict while closing portion 401-3 is controlled to open, causing air 601 to move towards an exit of carbon nanotube 417. Sequence 600 can then be repeated to cause further air to flow through carbon nanotube 417. Hence, sequence 600 forces air 601 within carbon nanotube 417 to move from closing portion 401-1 towards closing portion 401-4 (i.e. left to right with reference to FIG. 6); furthermore, presuming that an entrance of carbon nanotube 417 is located towards closing portion 401-1, and an exit of carbon nanotube 417 is located towards closing portion 401-4, sequence 600 causes air 601 to draw into the entrance and out the exit. Put another way, sequence 600 is similar to swallowing undulations of snakes, and moves air 601 there through similar to how a snake swallows food.

As air 601 can be heated air from cooling apparatus 112, sequence 600 further moves heat away from cooling apparatus 112 to apertures 110 when one or more carbon nanotubes 117 are similar to carbon nanotube 417. In other words, each of the one or more carbon nanotubes 117 comprises respective closing portions 401, device 101 further comprising one or more controllers 140 electrically connected to respective closing portions 401, each of one or more controllers 140 configured to independently open and close respective closing portions 401 of each of one or more carbon nanotubes 117 in a sequence to assist with flow of heated air there through.

Heat conduction also occurs via walls of one or more carbon nanotubes 117, as walls of each of one more carbon nanotubes 117 are configured to conduct heat away from cooling apparatus 112.

Further, one or more controllers 140 can be configured to control closing portions 401 to constrict in sequence 600 at a given speed and/or at a programmable speed, to change a volume and/or speed of air 601 that is pushed through carbon nanotubes 117, 417: i.e. pushing air 601 occurs by capturing a volume of air by first closing a closing portion 401 completely, partially closing an adjacent closing portion one right after. In other words, speed and volume of air flow through a carbon nanotube 117 can be controlled by controlling the relative times at which each closing portion 401 constricts and/or narrows and by controlling a degree to which each closing portion 401 constricts and/or narrows. The order of this sequence can preprogrammed be at an integrated circuit at one or more controllers 140; however, in some implementations, the integrated circuit can be dynamically editable via a port and built-in register map, and/or via communications with processor 120.

Figure 7:
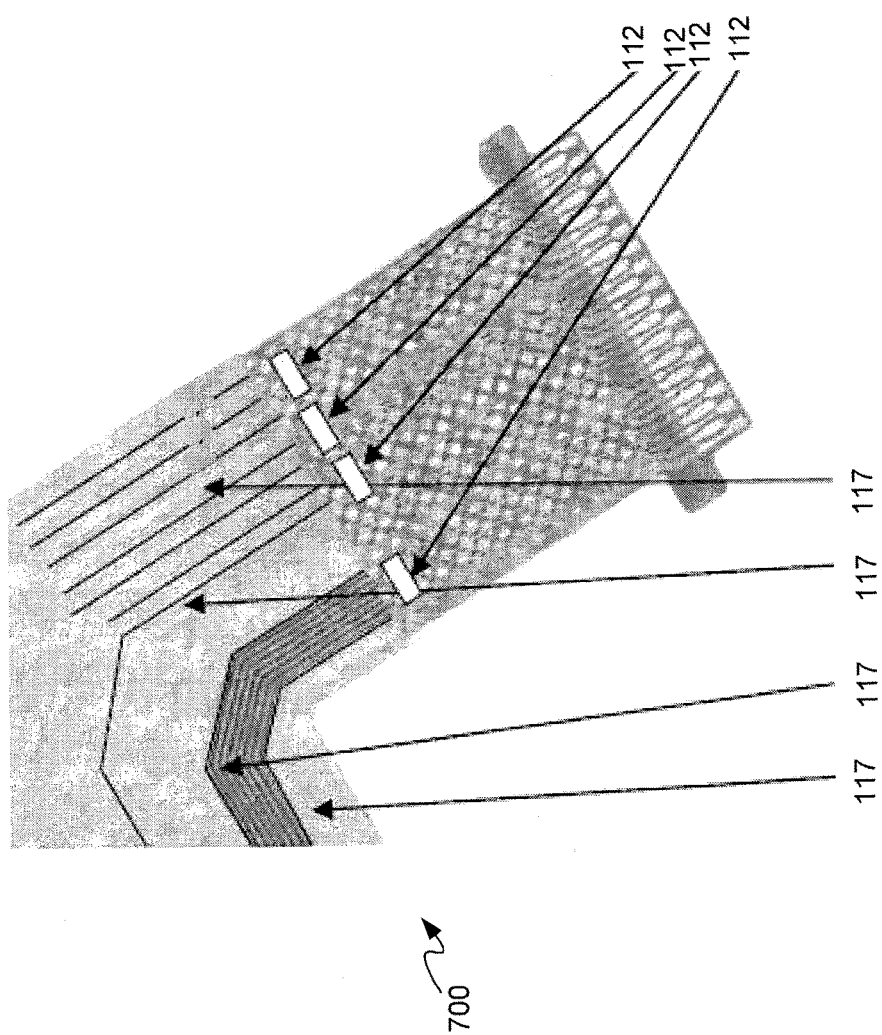
FIG. 7 depicts a portion of a flex cable with both carbon nanotubes and a plurality of cooling apparatuses integrated thereupon, according to non-limiting implementations.

As carbon nanotubes have small diameters, on the order of about 1 nm, they can be installed into devices, such as device 101, with minimal use of space, and/or integrated into existing parts in device 101. For example, attention is next directed to FIG. 7, which depicts a portion of flex cable 700 with both carbon nanotubes 117 and a plurality of cooling apparatuses 112 integrated thereupon. The plurality of cooling apparatuses 112 can be located on flex cable 700 at positions adjacent to heat producing devices, and carbon nanotubes 117 can be routed along flex cable 700 to terminate at an aperture 110, for example a same aperture where flex cable 700 terminates. For example, while not depicted, flex cable 700 can terminate at a connector at an aperture 110, and a respective exit of one or more of the carbon nanotubes 117 can comprise a hole in a connector at a respective aperture 110, thereby venting heated air there through.

Hence, device 101 can further comprise one or more flex cables 700, at least a portion of each of one or more carbon nanotubes 117 mounted thereupon. Further, cooling apparatus 112 can also be mounted on one or more flex cables 700, for example at a manufacturing facility for flex cable, and then later placed in device 101 when device 101 is being assembled.

Figure 8:
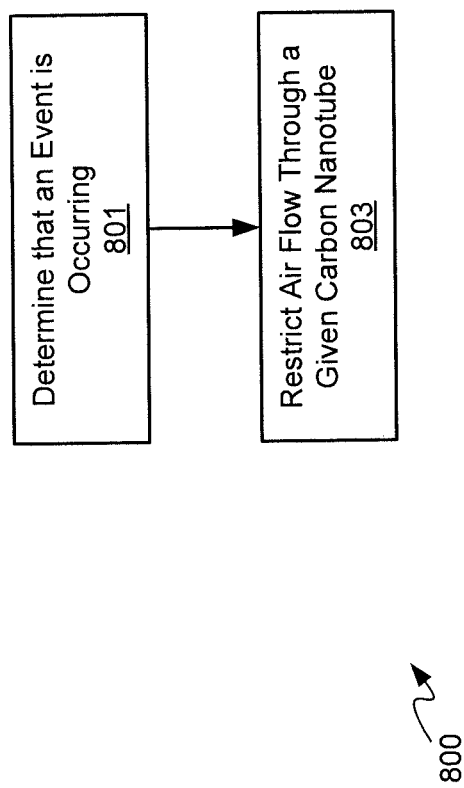
FIG. 8 depicts a flowchart of a block diagram of a method of managing cooling at a device, according to non-limiting implementations.

Attention is now directed to FIG. 8 which depicts a flowchart illustrating a method 800 of managing cooling at a device, according to non-limiting implementations. In order to assist in the explanation of method 800, it will be assumed that method 800 is performed using device 101. Furthermore, the following discussion of method 800 will lead to a further understanding of device 101 and its various components. However, it is to be understood that device 101 and/or method 800 can be varied, and need not work exactly as discussed herein in conjunction with each other, and that such variations are within the scope of present implementations. It is appreciated that, in some implementations, method 800 is implemented in device 101 by processor 120, for example by implementing application 145.

It is to be emphasized, however, that method 800 need not be performed in the exact sequence as shown, unless otherwise indicated; and likewise various blocks may be performed in parallel rather than in sequence; hence the elements of method 800 are referred to herein as "blocks" rather than "steps". It is also to be understood that method 800 can be implemented on variations of device 101 as well.

At block 801, processor 120 determines that an event is occurring, for example at processor 120, and/or at device 101. At block 803, processor 120, in response to determining that the event is occurring, restricts air flow through a given carbon nanotube 117. In some implementations of block 803, processor 120 can be configured to: communicate with the one or more controllers 140 to close a given carbon nanotube 117 based on a given associated event occurring at processor 120 and/or device 101.

Specifically, as described above, each of one or more controllers 140 can be further configured to close one or more of respective closing portions 401 to restrict flow of the heated air there through to prevent the heated air from flowing through an associated carbon nanotube 117, for example as depicted in view 5-II of FIG. 5. Hence, certain carbon nanotubes 117 can be prevented from venting heated air when given events occur at device 101.

In a non-limiting example, when a voice call occurs at device 101, and heated air is being pumped out of speaker aperture 110-1, such heated air can be uncomfortable for a user when speaker aperture 110-1 is placed against a user's ear so that the user can listen to voice data associated with the call.

In other words, as described above, device 101 can comprise interface 124, microphone 134, and speaker 132 for conducting voice calls at device 101, speaker 132 comprising speaker aperture 110-1, of the one or more apertures 110. To prevent heat from being vented from speaker aperture 110-1, processor 120 can be further configured to: detect the voice call occurring at device 101 (i.e. block 801) and communicate (i.e. at block 803) with one or more controllers 140 to close carbon nanotube 117-1 connecting cooling apparatus 112 to speaker aperture 110-1. However, heated air can continue to be vented through carbon nanotube 117-2 and aperture 110-2 and/or another carbon nanotube 117 and associated aperture 110 that is not adjacent a user's face and/or hand.

Processor 120 can be further configured to: detect that the voice call has ended and communicate with one or more controllers 140 to open associated carbon nanotube 117-1 connecting cooling apparatus 112 to speaker aperture 110-1. Hence, once the voice call is ended, heat can again be vented through speaker aperture 110-1.

Processor 120 can also restrict venting of heated air through given apertures based on other events, for example detection of a cable and/or connector being received at a given aperture 110 comprising a port for the connector: an associated carbon nanotube 117 can be closed when detection of the cable and/or connector occurs, and then opened when the cable and/or connector is no longer detected.

Processor 120 can further be configured to restrict venting of heated air through given apertures 110 based on proximity detection at device 101; for example, in these implementations, device 101 can comprise one or more sensors for detecting proximity, for example proximity to given apertures 110, and control venting of heated air accordingly. In other words, when proximity to a given aperture 110 is detected via a sensor, a corresponding carbon nanotube 117 can be closed, and then opened when proximity is no longer detected.

In some implementations, memory 122 can store a table and/or a lookup table which associates event with specific carbon nanotubes 117; processor 120 can process and/or consult such a table to determine which carbon nanotubes 117 to close when given events occur.

Hence, described herein is low profile cooling system for a device that can be mounted on existing components of the device, such as a flex cable. The cooling system comprises a thermal pump and carbon nanotubes connecting an outlet of the thermal pump to one or more apertures in a housing of the device. The thermal pump and/or carbon nanotubes can be mounted on flex cable in the device. Further, each carbon nanotube can be controlled to pump heated air there through using snake like "swallowing" undulations. Further, each carbon nanotube can be individually controlled to close and/or restrict flow of heated air there through, for example when given events occur at the device.

Those skilled in the art will appreciate that in some implementations, the functionality of device 101 can be implemented using pre-programmed hardware or firmware elements (e.g., application specific integrated circuits (ASICs), electrically erasable programmable read-only memories (EEPROMs), etc.), or other related components. In other implementations, the functionality of device 101 can be achieved using a computing apparatus that has access to a code memory (not shown) which stores computer-readable program code for operation of the computing apparatus. The computer-readable program code could be stored on a computer readable storage medium which is fixed, tangible and readable directly by these components, (e.g., removable diskette, CD-ROM, ROM, fixed disk, USB drive). Furthermore, it is appreciated that the computer-readable program can be stored as a computer program product comprising a computer usable medium. Further, a persistent storage device can comprise the computer readable program code. It is yet further appreciated that the computer-readable program code and/or computer usable medium can comprise a non-transitory computer-readable program code and/or non-transitory computer usable medium. Alternatively, the computer-readable program code could be stored remotely but transmittable to these components via a modem or other interface device connected to a network (including, without limitation, the Internet) over a transmission medium. The transmission medium can be either a non-mobile medium (e.g., optical and/or digital and/or analog communications lines) or a mobile medium (e.g., microwave, infrared, free-space optical or other transmission schemes) or a combination thereof.

Persons skilled in the art will appreciate that there are yet more alternative implementations and modifications possible, and that the above examples are only illustrations of one or more implementations. The scope, therefore, is only to be limited by the claims appended hereto.

What is claimed is:
1. A device comprising:
a housing comprising one or more apertures;
a heat producing device;
a cooling apparatus adjacent the heat producing device, the cooling apparatus comprising: an inlet; an outlet; and, a thermal pump configured to: draw air from the inlet to the heat producing device to form heated air, and exhaust the heated air from the outlet; and, one or more carbon nanotubes, a respective entrance of each of the one or more carbon nanotubes located at the outlet of the cooling apparatus, and a respective exit of each of the one or more carbon nanotubes terminating at a respective aperture of the one or more apertures, so that the heated air is vented through the one or more apertures, each of the one or more apertures comprising an aperture for one or more of a connector for an auxiliary device, an HDMI (High-Definition Multimedia Interface) port, a USB (Universal Serial Bus) port, an audio jack, a speaker and a microphone.

2. The device of claim 1, wherein each of the one or more carbon nanotubes comprises respective closing portions, the device further comprising one or more controllers electrically connected to the respective closing portions, each of the one or more controllers configured to independently open and close the respective closing portions of each of the one or more carbon nanotubes in a sequence to assist with flow of the heated air there through.

3. The device of claim 2, wherein each of the one or more controllers is further configured to close one or more of the respective closing portions to restrict flow of the heated air there through to prevent the heated air from flowing through an associated carbon nanotube.

4. The device of claim 2, further comprising a processor configured to:

communicate with the one or more controllers to close a given carbon nanotube based on a given associated event occurring at the processor.

5. The device of claim 4, further comprising a communication interface, the microphone, and the speaker for conducting voice calls at the device, the speaker comprising a speaker aperture, of the one or more apertures, wherein the processor is further configured to: detect a voice call occurring at the device and communicate with the one or more controllers to close a carbon nanotube connecting the cooling apparatus to the speaker aperture.

6. The device of claim 5, wherein the processor is further configured to:

detect that the voice call has ended and communicate with the one or more controllers to open the carbon nanotube connecting the cooling apparatus to the speaker aperture.

7. The device of claim 1, further comprising one or more flex cables, at least a portion of each of the one or more carbon nanotubes mounted thereupon.

8. The device of claim 7, wherein cooling apparatus is also mounted on the one or more flex cables.

9. The device of claim 1, further comprising a manifold located at the outlet, the manifold comprising respective entrances for each of the one or more carbon nanotubes.

10. The device of claim 1, wherein the respective exit of one or more of the carbon nanotubes comprises a hole in a connector at a respective aperture.

11. The device of claim 1, wherein the thermal pump comprises two electromagnets, a flexible single wing fan located there between, and a blocking flap, the electromagnets configured to control the flexible single wing fan to vibrate to generate vortices in the air, and the blocking flap configured to direct the vortices towards the outlet.

12. The device of claim 1, wherein walls of each of the one more carbon nanotubes are configured to conduct heat away from the cooling apparatus.

13. The device of claim 1, further comprising one or more of a mobile communication device, a mobile electronic device, a tablet device, and a laptop device.

\* \* \* \* \*